United States Patent [19]

Snyder et al.

[11] Patent Number: 5,100,868
[45] Date of Patent: Mar. 31, 1992

[54] PROCESS FOR PREPARING SUPERCONDUCTING FILMS BY RADIO-FREQUENCY-GENERATED AEROSOL PLASMA DEPOSITION

[75] Inventors: Robert L. Snyder, Alfred, N.Y.; Allen M. Hermann, Golden, Colo.; Xingwu Wang, Alfred, N.Y.; Hongmin Duan, Boulder, Colo.; Jemmy Hao, Alfred, N.Y.

[73] Assignees: Alfred University Inc.; University of Colorado Foundation, Inc., both of Alfred, N.Y.

[21] Appl. No.: 640,261

[22] Filed: Jan. 11, 1991

Related U.S. Application Data

[63] Continuation-in-part of Ser. No. 528,147, May 24, 1990, which is a continuation-in-part of Ser. No. 510,011, Apr. 17, 1990.

[51] Int. Cl.$^5$ .............. H01L 39/12; B05D 3/04; B05D 3/02; C23C 4/10
[52] U.S. Cl. .............. 505/1; 505/730; 505/737; 505/742; 427/34; 427/62; 427/226; 427/314; 427/377; 427/421; 427/45.1
[58] Field of Search .............. 427/34, 45.1, 62, 226, 427/314, 377, 421; 505/1, 730, 737, 742

[56] References Cited

U.S. PATENT DOCUMENTS 5,032,568 7/1991 Lau et al. .............. 505/1

*Primary Examiner*—Shrive Beck
*Assistant Examiner*—Margaret Burke
*Attorney, Agent, or Firm*—Howard J. Greenwald

[57] ABSTRACT

A two-step process for the preparation of a thallium-containing superconductive film is described.

In the first step of this process, an aerosol mist containing reactants necessary to produce a calcium/barium/-strontium/copper precursor material is provided. This mist is subjected to radio-frequency radiation while in the plasma region, and it thereafter is deposited onto an electrically grounded substrate.

In the second step of the process, the coated substrate is contacted with thallium-containing vapor.

20 Claims, 3 Drawing Sheets

PROCESS FOR PREPARING SUPERCONDUCTING FILMS BY RADIO-FREQUENCY-GENERATED AEROSOL PLASMA DEPOSITION

CROSS-REFERENCE TO RELATED APPLICATION

This is a continuation-in-part of U.S. patent application 07/528,147, filed on May 24, 1990, which in turn was a continuation-in-part of U.S. patent application U.S. Ser. No. 07/510,011, filed on Apr. 17, 1990.

FIELD OF THE INVENTION

A process for preparing a precursor of a superconducting film which contains thallium, calcium, copper, and either barium and/or strontium. The precursor contains calcium, copper, and either barium or strontium, and it is prepared by a radio-frequency plasma deposition process.

BACKGROUND OF THE INVENTION

Films of superconducting material, with thicknesses of from about 0.1 to about 500 microns, have been proposed for use in electronic circuits and superconducting devices. See, for example, an article by Peter E. Norris et al. entitled "In-situ thin films by MOCVD," Superconducting Industry, Vol. 3, No. 1, Spring, 1990.

The high Tc superconductors currently available are ceramic materials. It is known that ceramic materials may be fabricated into film by evaporation or by sputtering methods; however, both of these methods are usually conducted under vacuum. See, e.g., B. Oh et al., "Critical current densities and transport in superconducting YBaCuO films made by electron beam co-evaporation," Applied Physics Letters 51, 852 (1987); M. Hong et al., "Superconducting Y-Ba-Cu-0 oxide films by sputtering," Applied Physics Letters 51, 694 (1987); D. Dijkkamp et al., "Preparation of Y-Ba-Cu oxide superconductor thin films using pulsed laser evaporation from high Tc bulk material," Applied Physics Letters 51, 619 (1987); and S. Witanachchi et al., "Deposition of superconducting Y-Ba-Cu-0 films at 400 degrees centigrade without postannealing," Applied Physics Letters 53, 234 (1988). The disclosure of each of these references is hereby incorporated by reference into this specification.

One of the more interesting high Tc superconductive materials has the formula $(AO)_m M_2 Ca_{n-1} Cu_n O_{2n+2}$, wherein A is selected from the group consisting of thallium, and mixtures of thallium and lead, m is from about 1 to about 2 (and generally is 1 or 2), M is selected from the group consisting of barium, strontium, and mixtures thereof, and n is at least 1. In one preferred embodiment, A is thallium, m is 2, M is barium, and n is 3; this composition has a critical temperature of about 122 degrees Kelvin. This material is well known to those skilled in the art and is disclosed, e.g., an article by A. W. Sleight entitled "Chemistry of High-Temperature Superconductors," Science, Volume 242 (Dec. 16, 1988, at pages 1519-1527), the disclosure of which is hereby incorporated by reference into this specification.

Because thallium is a toxic material, thalliumn-containing superconductors are often made by a two-step process in which a precursor which does not contain thallium is first prepared, and thereafter it is reacted with thallium. Thus, for example, a process for preparing a solid precursor of barium-calcium-copper oxide material and thereafter reacting it with thallium oxide is disclosed in an article by Z. Z. Sheng et al., "$Tl_2O_3$ vapor process of making Tl-Ba-Ca-Cu-O superconductors," Applied Physics Letters, 53(26), 26 December 1988, the disclosure of which is hereby incorporated by reference into this specification.

Processes for making precursors of thin films containing the thallium-calcium-barium-copper oxide material are known to those in the art. See, for example, articles by D. G. Naugle et al., "Preparation of oriented high-Tc Tl-Ca-Ba-Cu-O thin films from co-condensed amorphous Ca-Ba-Cu alloys by post deposition oxidation and Tl diffusion, Journal of Applied Physics, 68(3), Aug. 1, 1989; and S. I. Shah et al., "Fabrication of Tl-Ba-Ca-Cu-O films by annealing rf-sputtered Ba-Ca-Cu-O films in thallium oxide vapors," Applied Physics Letters, 56(8), 19 February 1990. The disclosures of these references is incorporated by reference into this specification. The processes described in the aforementioned Naugle and Shah papers for making films consisting of superconductive material all require the use of a reduced pressure environment during the vapor deposition step. Such processes are not suitable for large scale production of the superconductive films. A substantial amount of energy, time, and money is required for a vacuum system and its operation; and such a system is not always suitable for large scale production. In addition, the size of the superconductive film which can be made by the vacuum deposition processes is limited by the size of the vacuum chamber used.

In copending patent application 07/528,147, applicants have described a one-step plasma deposition process in atmospheric environment for preparing yttrium-barium-copper, and bismuth-calcium-strontium-copper superconductive films. However, such a one-step atmospheric process is not suitable for the preparation of the thallium-containing superconductive materials because of the toxicity of thallium.

To the best of applicant's knowledge, no one has disclosed a plasma deposition process for making the precursor of the thallium superconductive material. Applicants believe that this might be due to the fact that the charge polarities of the ions comprising the precursor are not well understood by those skilled in the art.

It is known that, when a mixture of various compounds is subjected to the irradiation and heat of the radio-frequency plasma waves, a multiplicity of charged species or ions will be created at different rates; these species and/or ions may collide with each other and/or the plasma gas and/or the substrate, creating new particles. There is a substantial amount of uncertainty as to what species or ions or particles are generated with the plasma irradiation of a mixture of barium oxide, calcium oxide, and copper oxide. To the best of applicants' knowledge, there is no publication describing the ion spectra of emitted particles created by plasma irradiation of such mixture.

The rate of deposition of a charged species onto a substrate will vary with the charge polarity of the species and the electrical potential of the substrate. Because many mixtures create species with differing charge polarities upon irradiation with plasma waves, such mixtures do not necessarily deposit such species at a uniform rate upon any given substrate. Consequently, many films deposited by plasma deposition do not reflect the stoichiometry of the starting mixture of materials.

The problems associated with the non-stoichiometric deposition of reagents are illustrated in a paper by A. Shah et al., "rf plasma-generated superconducting $Y_1Ba_2Cu_3O_{7-x}$ films," Applied Physics Letters 57(14), 1 October 1990, the disclosure of which is hereby incorporated by reference into this specification. In the process described by this paper, a mixture containing 1 part of yttrium, 2.05 parts of barium, and 2.76 of copper was provided. This mixture was then subjected to irradiation by plasma waves. However, the film so produced contained 1.0 part of yttrium, 2.0 parts of barium, and 3.0 parts of copper. Apparently a substantial amount of trial and error was necessary in order for the writers to be able to produce a composition with the desired 1:2:3 molar ratio.

It is an object of this invention to provide a process for the preparation of a precursor film containing calcium, copper, and either barium or strontium that will produce such film at a rate of at least 1 micron per minute on a substrate with a surface area of at least about 30 square centimeters.

It is another object of this invention to provide a process for the preparation of a precursor film containing calcium, copper, and either barium or strontium which does not require the use of a vacuum environment.

It is another object of this invention to provide a process for the preparation of a precursor film containing calcium, copper, and either barium or strontium that is able to readily produce such materials in large sizes and/or complicated shapes.

It is another object of this invention to provide a process for the preparation of a precursor film containing calcium, copper, and either barium or strontium that is substantially homogeneous.

It is another object of this invention to provide a process for the preparation of a precursor film containing calcium, copper, and either barium or strontium which will produce a film with substantially the same stoichiometry as the stoichiometry of the starting materials used.

It is another object of this invention to provide a process for the preparation of a precursor film containing calcium, copper, and either barium and/or strontium which is relatively economical and flexible.

It is another object of this invention to provide a process for the preparation of a precursor film containing calcium, copper, and either barium and/or strontium which contains a relatively large amount of small grains.

It is another object of this invention to provide a process for the preparation a thallium-containing superconductive material by diffusion of a thallium-containing vapor into a precursor film containing calcium, copper, and either barium and/or strontium.

SUMMARY OF THE INVENTION

In accordance with this invention, there is provided a two-step process for the production of a thallium-containing superconductive coating or film.

In the first step of this process, an aerosol mist containing reactants necessary to form a calcium-barium/-strontium-copper precursor is provided. Thereafter, the mist is subjected to radio-frequency radiation while in the plasma region. Thereafter, the vaporized mixture is then deposited onto a substrate which is electrically grounded. The coated substrate is then contacted with a thallium-containing vapor to form the superconductive film or coating.

BRIEF DESCRIPTION OF THE DRAWING

The present invention will be more fully understood by reference to the following detailed description thereof, when read in conjunction with the attached drawing, wherein like reference numerals refer to like elements, and wherein.

DESCRIPTION OF THE PREFERRED EMBODIMENTS

Figure 1:
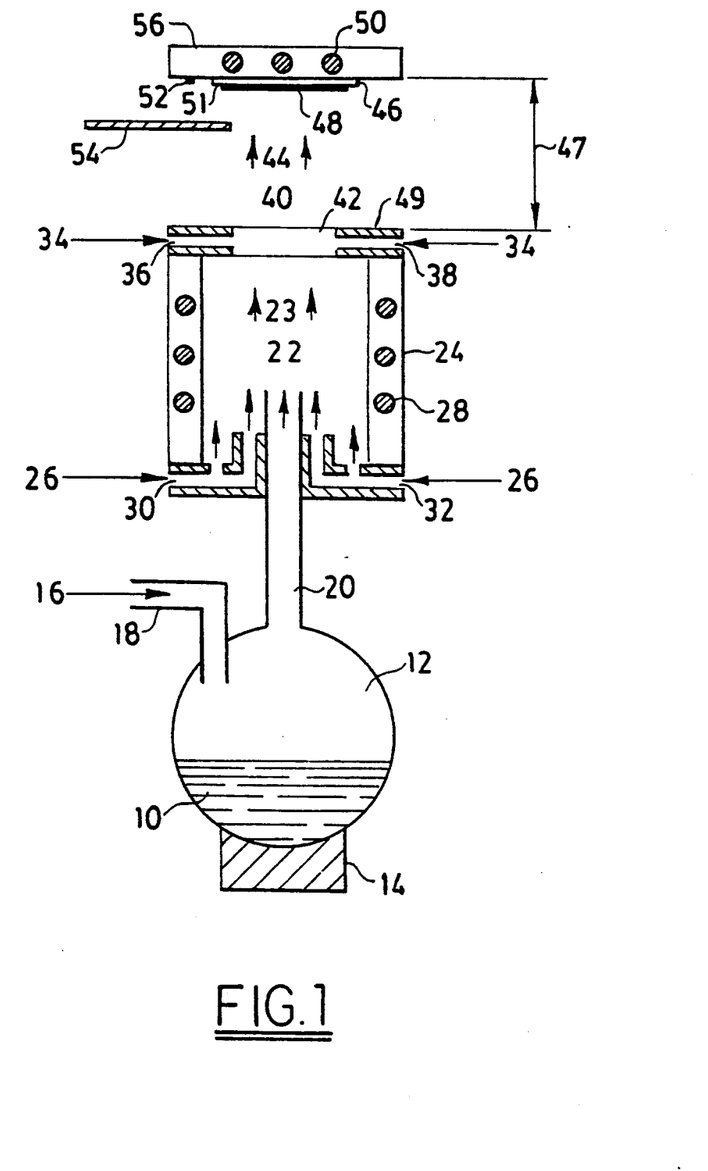
FIG. 1 is a system diagram illustrating one preferred embodiment of the process of this invention.

FIG. 1 illustrates a preferred embodiment of a portion of applicant's process, in which a precursor film material is made. In the first step of the process, a solution 10 of reagents is charged into misting chamber 12.

The solution 10 will contain reagents necessary to produce a precursor of a thallium-containing High Tc ceramic superconductor. These superconductors, and the reagents needed to produce them, are well known to those skilled in the art. Thus, these superconductors are described in an article by A. W. Sleight entitled "Chemistry of High-Temperature Superconductors," Science, Volume 242 (Dec. 16, 1988, at pages 1519–1527), the disclosure of which is hereby incorporated by reference into this specification.

One preferred class of superconducting materials is of the formula $(AO)_m M_2 Ca_{n-1} Cu_n O_{2n+2}$, wherein A is selected from the group consisting of thallium and mixtures of thallium and lead or bismuth, m is from about 1 to about 2 (and generally is 1 or 2), M is selected from the group consisting of barium, strontium, and mixtures thereof, and n is at least 1 and preferably is from about 1 to about 4. In one preferred embodiment, illustrated on page 1523 of the Sleight article, A is thallium, m is 2, M is barium, and n is 3; this composition has a critical temperature of about 122 degrees Kelvin.

In one embodiment, the starting materials used to make such precursor are powders with purities exceeding 99 percent.

The precursor produced in the first step of the process of this invention generally will have the formula $Ca_{n-1}M_2Cu_n O_x$, wherein x is less than about 11.

As will be apparent to those skilled in the art, the formula of the precursor will be similar to that of the final superconductive material with the exception that it will not contain thallium and/or thallium/lead. These superconductive materials of the formula $(AO)_m M_2 Ca_{n-1} Cu_n O_{2n+2}$ are well known to those skilled in the art and, by way of illustration, include $Tl Ba_2CaCu_2O_7$, $Tl Ba_2Ca_2Cu_3O_9$, $Tl Ba_2Ca_3Cu_4O_{11}$, $(Tl,Bi)Sr_2Cu_1O_5$, $(Tl,Bi)Sr_2CaCu_2O_7$, $(Tl,Pb)Sr_2CaCu_2O_7$, $(Tl,Pb)Sr_2Ca_2Cu_3O_9$, $Tl_2Ba_2CuO_6$, $Tl_2Ba_2CaCu_2O_8$, $Tl_2Ba_2Ca_2Cu_3O_{10}$, and the like.

In one embodiment, compounds of calcium, barium, and copper are present in a solution in the stoichiometric ratio of calcium:barium:copper of about 2:2:3. In this 
embodiment, it is preferred to use water-soluble salts such as, for example, the nitrates or chlorides of these metals. Alternatively, one may use salts soluble in solvents other than water. Some of these other solvents which may be used to prepare the 2:2:3 material include nitric acid, hydrochloric acid, phosphoric acid, sulfuric acid, and the like. As is well known to those skilled in the art, many other suitable solvents may be used; see, e.g., J. A. Riddick et al., "Organic Solvents, Techniques of Chemistry," Volume II, 3rd edition (Wiley-Interscience, New York, N.Y., 1970), the disclosure of which is hereby incorporated by reference into this specification.

In one embodiment, compounds of calcium, barium, and copper are present in a solution in the stoichiometric ratio of barium:calcium:copper of about 2:3:4.

In one embodiment, compounds of calcium, barium, and copper are present in a solution in the stoichiometric ratio of barium:calcium:copper of about 2:1:2.

In one embodiment, compounds of calcium, strontium, and copper are present in a solution in the stoichiometric ratio of calcium:strontium:copper of about 2:2:3.

In one embodiment, compounds of calcium, strontium, and copper are present in a solution in the stoichiometric ratio of strontium:calcium:copper of about 2:3:4.

In one embodiment, compounds of calcium, strontium, and copper are present in a solution in the stoichiometric ratio of strontium:calcium:copper of about 2:1:2.

In one embodiment, one or more of the aforementioned reagents may be used in oxide form rather than in the form of their salts. In this embodiment, the solvent used is generally one which will form a solution with the oxide(s) such as, for example, inorganic acids such as, e.g., nitric acid, hydrochloric acid, phosphoric acid, sulfuric acid, and the like.

In general, one may use commercially available reagent grade materials. Thus, by way of illustration and not limitation, one may use the following reagents available in the 1988-1989 Aldrich catalog (Aldrich Chemical Company, Inc., Milwaukee, Wis.): barium chloride, catalog number 31,866- 3; barium nitrate, catalog number 32,806-5; barium sulfate, catalog number 20,276-2; bismuth chloride, catalog number 25,414-2; bismuth nitrate pentahydrate, catalog number 25,415- 0; calcium chloride hydrate, catalog number 20,294-0; calcium nitrate hydrate, 20,296.7; calcium sulfate, catalog number 25,569-6; copper chloride dihydrate, 30,748-3; copper nitrate hydrate, 22,963-6; copper sulfate pentahydrate, catalog number 20,316-5; strontium chloride hexhydrate, catalog number 20,466- 3; strontium nitrate, catalog number 20,449-8; and the like. This list is merely illustrative, and other compounds which can be used will be readily apparent to those skilled in the art. Thus, any of the desired reagents also may be obtained from the 1989-1990 AESAR catalog (Johnson Matthey/AESAR Group, Seabrook, N.H.), the 1990/1991 Alfa catalog (Johnson Matthey/Alfa Products, Ward Hill, Ma.), the Fisher 88 catalog (Fisher Scientific, Pittsburgh, Pa.), and the like.

As long as the metals present in the desired superconductive material are present in solution 10 in the desired stoichiometry, it does not matter whether they are present in the form of a salt, an oxide, or in another form. In one embodiment, however, it is preferred to have the solution contain either the salts of such metals, or their oxides.

The solution 10 of the compounds of such metals preferably will be at a concentration of from about 0.01 to about 1,000 grams of said reagent compounds per liter of the resultant solution. As used in this specification, the term liter refers to 1,000 cubic centimeters.

In one embodiment, it is preferred that solution 10 have a concentration of from about 1 to about 300 grams per liter and, preferably, from about 25 to about 170 grams per liter. It is even more preferred that the concentration of said solution 10 be from about 100 to about 160 grams per liter. In an even more preferred embodiment, the concentration of said solution 10 is from about 140 to about 160 grams per liter.

Referring again to FIG. 1, the solution 10 in misting chamber 12 is preferably caused to form into an aerosol, such as a mist.

The term aerosol, as used in this specification, refers to a suspension of ultramicroscopic solid or liquid particles in air or gas, such as smoke, fog, or mist. See, e.g., page 15 of "A dictionary of mining, mineral, and related terms," edited by Paul W. Thrush (U.S. Department of the Interior, Bureau of Mines, 1968), the disclosure of which is hereby incorporated by reference into this specification. In general, the aerosol particles have diameters of from about 0.1 to about 100 microns and, preferably, less than about 10 microns.

As used in this specification, the term mist refers to gas-suspended liquid particles which have diameters less than 10 microns.

The aerosol/mist consisting of gas-suspended liquid particles with diameters less than 10 microns may be produced from solution 10 by any conventional means which causes sufficient mechanical disturbance of said solution. Thus, one may use mechanical vibration. In one preferred embodiment, ultrasonic means are used to mist solution 10.

As is known to those skilled in the art, ultrasonic sound waves (those having frequencies above 20,000 hertz) may be used to mechanically disturb solutions and cause them to mist. Thus, by way of illustration, one may use the ultrasonic nebulizer sold by the DeVilbiss Health Care, Inc. of Somerset, Pa.; see, e.g., the Instruction Manual for the "Ultra-Neb 99 Ultrasonic Nebulizer, publication A-850-C (published by DeVilbiss, Somerset, Pa., 1989), the disclosure of which is hereby incorporated by reference into this specification.

In the embodiment shown in FIG. 1, the oscillators of ultrasonic nebulizer 14 are shown contacting an exterior surface of misting chamber 12. In this embodiment, the ultrasonic waves produced by the oscillators are transmitted via the walls of the misting chamber 12 and effect the misting of solution 10.

In another embodiment, not shown, the oscillators of ultrasonic nebulizer 14 are in direct contact with solution 10.

It is preferred that the ultrasonic power used with such machine should be in excess of one watt and, more preferably, in excess of 10 watts. In one embodiment, the power used with such machine exceeds about 50 watts.

During the time solution 10 is being caused to mist, it is preferably contacted with carrier gas to apply pressure to the solution and mist. It is preferred that a sufficient amount of carrier gas is introduced into the system at a sufficiently high flow rate so that pressure on the system is in excess of atmospheric pressure. Thus, for example, in one embodiment wherein chamber 12 has a volume of about 200 cubic centimeters, the flow rate of the carrier gas was from about 100 to about 150 milliliters per minute.

The carrier gas 16 is introduced via feeding line 18 at a rate sufficient to cause solution 10 to mist at a rate of from about 0.5 to about 20 milliliters per minute. In one embodiment, the misting rate of solution 10 was from about 1.0 to about 3.0 milliliters per minute.

Substantially any gas which facilitates the formation of plasma may be used as carrier gas 16. Thus, by way of illustration, one may use oxygen, air, argon, nitrogen, and the like. It is preferred that the carrier gas used be a compressed gas under a pressure in excess 760 millimeters of mercury. In this embodiment, the use of the compressed gas facilitates the movement of the mist from the misting chamber 12 to the plasma region 22.

The misting container 12 may be any reaction chamber conventionally used by those skilled in the art and should preferably be constructed out of such acid-resistant materials such as glass, plastic, and the like.

The mist from misting chamber 12 is fed via misting outlet line 20 into the plasma region 22 of plasma reactor 24. In plasma reactor 24, the mist is mixed with plasma generated by plasma gas 26 and subjected to radio frequency radiation provided by a radio-frequency coil 28.

The plasma reactor 24 provides energy to form plasma and to cause the plasma to react with the mist. Any of the plasmas reactors well known to those skilled in the art may be used as plasma reactor 24. Some of these plasma reactors are described in J. Mort et al., "Plasma Deposited Thin Films" (CRC Press Inc., Boca Raton, Fla., 1986); "Methods of Experimental Physics," Volume 9—Parts A and B, Plasma Physics (Academic Press, New York, 1970/1971); N. H. Burlingame, "Glow Discharge Nitriding of Oxides," Ph.D. thesis (Alfred University, Alfred, N.Y., 1985), available from University Microfilm International, Ann Arbor, Mich.. Each of these publications is hereby incorporated by reference into this specification.

In one preferred embodiment, the plasma reactor 24 was the "model 56 torch" available from the TAFA Inc. of Concord, N.H. It was operated at a frequency of about 4 megahertz and an input power of 30 kilowatts.

Into feeding lines 30 and 32 is fed plasma gas 26. As is known to those skilled in the art, a plasma can be produced by passing gas into a plasma reactor. A discussion of the formation of plasma is contained in B. Chapman's "Glow Discharge Processes" (John Wiley & Sons, New York, 1980), the disclosure of which is hereby incorporated by reference into this specification.

In one preferred embodiment, the plasma gas used is a mixture of argon and oxygen. In another embodiment, the plasma gas is a mixture of nitrogen and oxygen. In yet another embodiment, the plasma gas is pure argon or pure nitrogen.

When the plasma gas is pure argon or pure nitrogen, it is preferred to introduce into the plasma reactor at a flow rate of from about 5 to about 30 liters per minute.

When a mixture of oxygen and either argon or nitrogen is used, the concentration of oxygen in the mixture should preferably be from about 1 to about 40 volume percent and, preferably, from about 15 to about 25 volume percent. When such a mixture is used, the flow rates of each gas in the mixture should be adjusted to obtain the desired gas concentrations. Thus, by way of illustration, in one embodiment which uses a mixture of argon and oxygen, the argon flow rate was 15 liters per minute, and the oxygen flow rate was 40 liters per minute.

In one embodiment, auxiliary oxygen 34 is fed into the top of reactor 24, between the plasma region 22 and the flame region 40, via lines 36 and 38. In this embodiment, the auxiliary oxygen is not involved in the formation of plasma but is involved in the enhancement of the oxidation of the oxide superconductive material.

Radio frequency energy is applied to the reagents in the plasma reactor 24, and it causes vaporization of the mist. In general, the energy is applied at a frequency of from about 100 to about 30,000 kilohertz. In one embodiment, the radio frequency used is from about 1 to 20 megahertz. In another embodiment, the radio frequency used is from about 3 to about 5 megahertz.

As is known to those skilled in the art, such radio frequency alternating currents may be produced by conventional radio frequency generators. Thus, by way of illustration, said TAPA Inc. "model 56 torch" is attached to a radio frequency generator rated for operation at 35 kilowatts which manufactured by Lepel Company (a division of TAFA Inc.) and which generates an alternating current with a frequency of 4 megahertz at a power input of 30 kilowatts. Thus, e.g., one may use an induction coil driven at 2.5–5.0 megahertz which is sold as the "PLASMOC 2" by ENI Power Systems, Inc. of Rochester, N.Y.

The use of these type of radio-frequency generators is described in the Ph.D. theses entitled (1) "Heat Transfer Mechanisms in High-Temperature Plasma Processing of Glasses," Donald M. McPherson (Alfred University, Alfred, N.Y., January, 1988) and (2) the aforementioned Nicholas H. Burlingame's "Glow Discharge Nitriding of Oxides." The disclosure of each of these publications is hereby incorporated by reference into this specification.

The plasma vapor 23 formed in plasma reactor 24 is allowed to exit via the aperture 42 and can be visualized in the flame region 40. In this region, the plasma contacts air which is at a lower temperature than the plasma region 22, and a flame is visible. A theoretical model of the plasma/flame is presented on pages 88 et seq. of said McPherson thesis.

The vapor 44 present in flame region 40 is propelled upward towards substrate 46. Any material onto which vapor 44 will condense may be used as a substrate.

In one preferred embodiment, substrate 46 consists essentially of a magnesium oxide material such as single crystal magnesium oxide, polycrystalline magnesium oxide, and the like.

In another embodiment, the substrate 46 consists essentially of zirconia such as, e.g., yttrium stabilized cubic zirconia. The material in the substrate may be in single crystalline form, or it may be polycrystalline.

In another embodiment, the substrate 46 consists essentially of a material selected from the group consisting of strontium titanate, nickel foil, stainless steel, alumina, sapphire, and the like.

In one preferred embodiment, the substrate consists essentially of a single crystalline material. In this embodiment, the film or coating deposited onto the substrate may be aligned in accordance with the substrate alignment.

As used in this specification, the term "single crystalline" or "single crystal" refers to a material with a periodicity which extends throughout the entire mass of the material. As is known to those skilled in the art, in crystalline solids the atoms or molecules are stacked in a regular manner, forming a three-dimensional pattern which may be obtained by a three-dimensional repetition of a certain pattern unit called a "unit cell." When the periodicity of a pattern extends throughout a certain piece of material, one speaks of a single crystal. A single crystal is formed by the growth of a crystal nucleus without secondary nucleation or impingement on other crystals. See, e.g., page 389 of Volume 12 of the McGraw-Hill Encyclopedia of Science & Technology (McGraw-Hill Book Company, New York, 1977), the disclosure of which is hereby incorporated by reference into this specification.

By comparison, the term polycrystal refers to a material composed of variously oriented crystals.

The effects of a substrate upon the crystal growth of a material deposited upon it are discussed in Russel J. Hill's "Physical Vapor Deposition" (Temescal division of the BOC Group, Inc., Berkely, Calif., 1986), the disclosure of which is hereby incorporated by reference into this specification. See, for example, the discussion of epitaxial growth appearing on pages 75, 76, and 112 of this book.

In one embodiment, said substrate is a single-crystal substrate. Some suitable single-crystal substrates include sapphire, magnesium oxide, gallium arsenide, $Nb_3Ir$, $Nb_3Sn$, cubic zirconia, strontium titanate, lanthanum aluminate, $LaGaO_3$, $KTaO_3$, $LiNbO_3$, silicon, silicon oxide, and the like. A description of some substrates which may be used to facilitate epitaxial superconductor film growth is presented in Steven K. Ruggiero et al.,s "Superconducting Devices" (Academic Press, Inc., Boston, 1990), the disclosure of which is hereby incorporated by reference into this specification. Reference may be had to page 286 of this book.

In one preferred embodiment, the substrate is a semiconductor. As used in this specification, the term semiconductor refers to a material in which electric current is carried by electrons or holes and whose electrical conductivity when extremely pure rises exponentially with temperature and may be increased from this low intrinsic value by many orders of magnitude by doping with electrically active impurities. See, e.g., pages E-97 to E-102 of the "CRC Handbook of Chemistry and Physics,, 63rd Edition (CRC Press, Inc., Boca Raton, Fla., 1982-1983), the disclosure of which is hereby incorporated by reference into this specification. Many different suitable semiconductors are discussed on these pages, including the adamantine semiconductors and the octahedral semiconductors.

When the substrate is comprised of semiconductive material, it can either consist essentially of such material or, alternatively, be coated with a buffer. By way of illustration, suitable buffers include cubic zirconia, magnesium oxide, and the like. These and similar buffers are discussed in, e.g., (1)S. Witanachchi et al. "Laser Deposition of Superconducting and Semiconducting Thin Films," in "Superconductivity and its applications," edited by H. Kwok et al. (Elsevier Company, New York, 1988), and (2) H. Kwok et al., "Laser evaporation deposition of superconducting and dielectric thin films," Applied Physics Letters, Volume 52, 1825 (1988). The disclosure of each of these publications is hereby incorporated by reference into this specification.

One advantage of applicants, process is that the substrate may be of substantially any size or shape, and it may be stationary or movable. Because of the speed of the coating process, the substrate 46 may be moved across the aperture 42 and have any or all of its surface be coated with the film 48.

The substrate may be at ambient temperature. Alternatively, one may use additional heating means to heat the substrate prior to, during. or after deposition of the coating.

In one preferred embodiment, heater 50 is used to heat the substrate to a temperature of from about 400 to about 800 degrees centigrade. In another preferred embodiment, the substrate is heated to a temperature of from about 550 to about 650 degrees centigrade.

Temperature sensing means 52 may be used to sense the temperature of the substrate and, by feedback means (not shown) adjust the output of heater 50. In one embodiment, not shown, when the substrate 46 is relatively near flame region 40, then optical pyrometry measurement means (not shown) may be used to measure the temperature near the substrate.

In one embodiment, illustrated in FIG. 1, a shutter 54 is used to selectively interrupt the flow of vapor 44 to substrate 46. The use of this shutter 54 is important prior to the time the flame region has become stable; and the vapor should not be allowed to impinge upon the substrate prior to such time.

The substrate 46 may be moved in a plane which is substantially parallel to the top of plasma chamber 24. Alternatively, or additionally, it may be moved in a plane which is substantially perpendicular to the top of plasma chamber 24. In one embodiment, the substrate 46 is moved stepwise along a predetermined path to coat the substrate only at certain predetermined areas.

In one embodiment, rotary substrate motion is utilized to expose as much of the surface of a complex-shaped article to the coating. This rotary substrate motion may be effected by conventional means. See, e.g., "Physical Vapor Deposition," edited by Russel J. Hill (Temescal Division of The BOC Group, Inc., Berkeley, Calif., 1986), the disclosure of which is hereby incorporated by reference into this specification.

The process of this invention allows one to coat an article at a deposition rate of from about 0.01 to about 10 microns per minute and, preferably, from about 0.1 to about 1.0 microns per minute, with a substrate with an exposed surface of 35 square centimeters. One may determine the thickness of the film coated upon said reference substrate material (with an exposed surface of 35 square centimeters) by means well known to those skilled in the art.

The film thickness can be monitored in situ, while the vapor is being deposited onto the substrate. Thus, by way of illustration, one may use an IC-6000 thin film thickness monitor (as referred to as "deposition controller" ) manufactured by Leybold Inficon Inc. of East Syracuse, N.Y.

The deposit formed on the substrate may be measured after the deposition by standard profilemetry techniques. Thus, e.g., one may use a DEKTAK Surface Profiler, model number 900051 (available from Sloan Technology Corporation, Santa Barbara, Calif.)

In general, the process of this invention may be used to deposit films which are from about 0.1 to about 500 microns and, preferably, from about 1 to about 100 microns. In a more preferred embodiment, the films deposited by the process are from about 10 to about 50 microns in thickness.

The "as-deposited" film produced by the process of this invention is consists of uniform, small grains. The term "as-deposited" refers to the film prior to the time it is subjected to post-annealing.

In general, at least about 80 volume percent of the particles in the as-deposited film are smaller than about 1 microns. It is preferred that at least about 90 percent of such particles are smaller than 1 micron. Because of this fine grain size, the surface of the film is relatively smooth.

In one preferred embodiment, during the vapor deposition process, the substrate is electrically grounded during deposition; this embodiment is described below.

It is preferred that the substrate be electrically grounded during deposition of the precursor material on it.

As is known to those skilled in the art, grounding is intentional electrical connection to a reference conducting plane, which may be the earth (hence the term ground), but which more generally consists of a specific array of interconnected electrical conductors, referred to as the grounding conductor. See, e.g., pages 312–320 of Volume 6 of the "McGraw-Hill Encyclopedia of Science & Technology," the disclosure of which is hereby incorporated by reference into this specification.

In one preferred embodiment, illustrated in FIG. 1, substrate holder 56 consists of copper and is connected by a copper wire (not shown) to the chassis (not shown) of the power supply (not shown) of the radio-frequency plasma generator. Because of this grounding of the substrate holder, any charge will is present on and/or in the vicinity of the holder 56 will be neutralized through the ground.

FIG. 1 has illustrated one means of grounding charges on or in the vicinity of substrate holder 56. Any of the other grounding means known to those skilled in the art also may be used. Thus, e.g., one may run a conductive wire to the earth to bleed off charges which otherwise would tend to accumulate on the substrate holder 56. If such charges are not bled off, they will tend to inhibit deposition of the precursor thin film.

In the preferred embodiment illustrated in FIG. 1, substrate holder 56 is disposed so that the distance 47 between the top 49 of the plasma reactor and the bottom 51 of the substrate is at least 10 centimeters.

In one preferred embodiment, the pressure of the gases impinging upon the substrate 46 exceeds 760 millimeters of mercury. The superatmospheric pressure in the impinging gas may be created by utilizing relatively high flow rates in the plasma gas and/or the mist carrier gas and/or the auxiliary gas.

Referring to FIG. 1, the oxygen in the plasma gas 26 is preferably supplied at a flow rate of from about 10 to about 50 liters per minute. The argon in the plasma gas 26 is preferably supplied at a flow rate of from about 30 to about 60 liters per minute. The ratio of the oxygen flow rate to the argon flow rate should preferably be from about 1:3 to about 3:1.

The carrier gas 16 (oxygen and/or argon) is preferably introduced into the mist chamber at a flow rate of from about 50 to about 200 milliliters per minute. The auxiliary gas (oxygen) 34 is preferably fed to the system at a rate of from about 0 to 10 liters per minute.

It is preferred that the generation of the vapor in plasma reactor 24 be conducted under substantially atmospheric pressure conditions. As used in this specification, the term "substantially atmospheric" refers to a pressure of at least about 600 millimeters of mercury and, preferably, from about 600 to about 1,000 millimeters of mercury. It is preferred that the vapor generation occur at about atmospheric pressure. As is well known to those skilled in the art, atmospheric pressure at sea level is 760 millimeters of mercury; see, e.g., page 60 of said "A dictionary of mining, mineral, and related terms."

The process of this invention may be used to produce precursor coatings on a flexible substrate such as, e.g., stainless steel strips, nickel strips, silver strips, gold strips, copper strips, aluminum strips, and the like. One may deposit the coating directly onto such a metallic strip. Alternatively, one may first deposit one or more buffer layers onto the strip(s).

The deposition of buffer layers between a substrate and a precursor coating is well known to those skilled in the art. See, e.g., (1)H. S. Kwok et al., "Laser evaporation deposition of superconducting and dielectric thin films," Applied Physics Letters, Volume 52 (21), May 23, 1988; (2)S. Witanachchi et al., "Laser Deposition of Superconducting and Semiconducting Thin Films," in "Superconductivity and its Applications," edited by H. S. Kwok et al. (Elsevier Company, New York, 1988), at pages 194 et seq. The disclosure of each of these publications is hereby incorporated by reference into this specification.

In the second step of this process, the precursor film or coating provided in the first step is thallinated.

The precursor film or coating may be thallinated by means known to those skilled in the art. See, for example, the D. G. Naugle et al., the Z. Z. Sheng et al., and the S. I. Shah et al. articles cited elsewhere in this specification.

It is preferred, in the first step of the thallination procedure, to place the precursor film or coating in a sealed furnace. While in such furnace, the precursor material is heated to a temperature of from about 750 to about 900 degrees centigrade while it is contacted with a thallination agent for at least about 1 minute. It is preferred to contact the precursor material with the thallination agent for at least about 5 minutes and, more preferably, for at least about 20 minutes. In one especially preferred embodiment, the precursor material is contacted with the thallination agent for at least about 25 minutes.

Any suitable thallination agent may be used in the process. Thus, by way of illustration and not limitation, one may use thallium oxides such as $Tl_2O$ and $Tl_2O_3$. Thus, e.g., one may use $Tl_2Ba_2CuO_6$ material. Thus, one may use Tl-Ca-Ba-Cu-O pellets which may be made by mixing $Tl_2O_3$ with the aforementioned precursor material.

In one embodiment, the thallination agent is disposed within the same furnace as the precursor material is disposed; as both materials are heated, thallium is caused to evaporate, and it diffuses into the precursor film.

Figure 2:
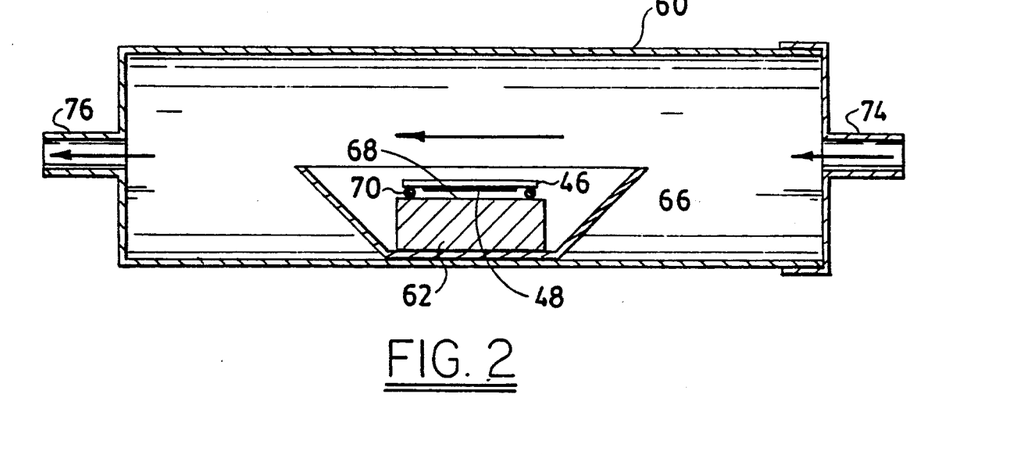
FIG. 2 is a sectional view of a preferred thallination apparatus which may be used in the process of the invention.

A preferred thallination process is illustrated in FIG. 2. The thallination occurs in quartz reactor 60.

Any conventional thallination reagent maybe used in quartz reactor 60. In one preferred embodiment, illustrated in FIG. 2, the thallination agent is made from an intermediate material comprised of barium, calcium, copper, and oxygen atoms.

In one aspect, such an intermediate material may be made by mixing barium oxide with calcium oxide and copper oxide to form an intermediate material with the formula $Ba_2Ca_2Cu_3O_x$ This intermediate material is then preferably heat-treated. It may be placed in a muffle furnace (not shown) and heated to a temperature of from about 750 to about 950 degrees centigrade for at least about 18 hours and, preferably, from about 18 to about 36 hours. It is preferred that this heat treatment be conducted under atmospheric pressure. Thus for example, one may heat treat the sample at 850 degrees centigrade for 24 hours.

After the intermediate material has been heat treated, it may be cooled to room temperature. Thus, in one embodiment, the material is cooled at a rate of 2 degrees Centigrade per minute to room temperature.

The heat-treated material is then preferably ground until substantially all of its particles are smaller than 50 microns. In one embodiment, the material is ground until substantially all of its particles are smaller than about 20 microns.

A thallination agent may be prepared by mixing thallium oxide ($Tl_2O_3$) with the ground $Ba_2Ca_2Cu_3O_x$ material. The materials may be thoroughly mixed in a mole ratio of from about 1:3 to about 2:1 (thallium oxide/intermediate). Thus, in one embodiment, the materials are mixed in a substantially 1:1 mole ratio to form $Tl_2Ba_2Ca_2Cu_3O_{10-y}$ In another embodiment, an intermediate material of the formula $CaBa_2Cu_2O_z$ is formed by the aforementioned procedure. Thereafter, 1 mole of thallium oxide is mixed with three moles of this intermediate material, to form TlBaCaCuO. In one embodiment, $Tl_2CaBa_2Cu_2O_z$ is formed.

In another embodiment, 2 moles of thallium oxide are mixed with 1 mole of said $CaBa_2Cu_2O_z$ to form TlCaBaCuO. In one embodiment, $Tl_2CaBa_2Cu_2O_z$ is formed.

In yet another embodiment, an intermediate material of the formula $Ba_2CuO_q$ is formed by the aforementioned procedure and, thereafter, is mixed with the thallium oxide in a ratio of from about 1:3 to about 2:1 to form TlBaCu. In one aspect of this embodiment, $Tl_2Ba_2CuO_q$ is formed.

The thallinated material may then be pelletized by conventional means. In one embodiment, the thallinated material is pressed with a Carver laboratory press at a pressure of at least about 2,000 pounds per square inch to form pellets.

The pelletized $Tl_2Ba_2Ca_2Cu_3O_{10-y}$ material may be used to thallinate the coated substrate 64. Referring again to FIG. 2, the aforementioned thallination disc 62 may be placed into an quartz boat 66. Thereafter, the coated substrate 64 may be placed on or above the top surface of thallination pellet 62. In one embodiment, the coated substrate 64 is supported on an O-ring so that it is from about 0.1 to about 1.0 millimeters above top surface 68, supported on a copper O-ring 70.

It is important that the film 72 of the coated substrate be placed on the O-ring so that the film 72 faces the surface 68 of the thallination pellet 62.

A sealed quartz tubular furnace 60 equipped with an oxygen inlet line 74 and a thallium-safe exhaust line 76 may be preheated to a temperature of from about 750 to about 900 degrees Centigrade. Thereafter, the quartz boat 66 assembly may be placed into this preheated furnace 60 and subjected to a temperature of from about 750 to about 900 degrees Centigrade for at least 1 minute and, preferably, for at least about 5 minutes. It is preferred that, during this heating, oxygen be flowed over the heated sample at a rate of from about 0.1 to about 20 milliliters per minute. During the thallination, thallium gas is preferably vented to a mineral acid solution (not shown), wherein it is neutralized.

After being so heated, the sample may then be cooled to ambient temperature. It is preferred that the material be cooled at a rate of from about 0.5 to about 10 degrees Centigrade per minute. It is preferred that, during this cooling and all prior portions of the thallination, the oxygen flow be continued.

The resistance of the sample may be determined by a standard four point measurement technique (see U.S. Pat. No. 4,960,760, the disclosure of which is hereby incorporated by reference into this specification.

The following examples are presented to illustrate the claimed invention but are not to be deemed limitative thereof. Unless otherwise specified, all parts are by weight and all temperatures are in degree Centigrade.

EXAMPLE 1

2.7901 grams of reagent grade calcium nitrate (catalog number 12364, 1990/91 Alfa Catalog, Johnson Matthey Alfa Products, Ward Hill, Ma.), 3.0877 grams of barium nitrate (catalog number 30481, 1990/91 Alfa catalog), and 4.2063 grams of copper (II) nitrate (catalog number 12523, 1990/91 Alfa catalog) were mixed with 100 milliliters of distilled water to form an aqueous solution with a concentration of 100 grams per liter. The solution was then poured into a hemispherical plastic mist chamber with a capacity of 200 cubic centimeters which was equipped with a gas inlet and a mist outlet.

The mist chamber containing the solution was placed onto an ultrasonic nebulizer generator, model "Utra-Neb 99 Ultrasonic Neublizer" (sold by DeVilbiss Heath Care, Inc., Somerset, Pa.); the ultrasonic generator was operated at a power of 70 watts and a frequency of 1.63 megahertz; the misting droplets formed were from about 0.5 to about 5.0 microns diameter in size. The gas inlet of the chamber was connected to a source of oxygen flowing at a rate of 130 milliliters per minute; the mist rate of the solution exiting the chamber was 2 milliliters per minute.

The output from the misting chamber was connected to a TAFA plasma reactor (model "56 torch," available from TAFA Inc. of Concord, N.H.) equipped with a Lepel radio frequency generator; the radio frequency generator was operated at a power of 30 kilowatts and produced an alternating current of 4 megahertz. A mixture of oxygen and argon was introduced into the bottom portion of the plasma reactor; the oxygen flow rate was 40 liters per minute, and the argon flow rate was 15 liters per minute. An auxiliary source of oxygen was flowed into the top of the plasma reactor at a flow rate of 5 liters per minute. The distance between the top of the plasma reactor and the substrate was 10 centimeters.

The vapor from the plasma reactor deposited onto a single crystal magnesium oxide article with a crystal orientation of 100, which was 1.0 centimeter by 1.0 centimeter by 0.1 centimeters and which had been heated to a substrate temperature of 600 degrees centigrade. This substrate was disposed within a rectangular (5 centimeters × 7 centimeters × 1 centimeter) copper substrate holder which was connected by copper wire to the chassis of the power supply of the Lepel radio-frequency generator. The deposition rate was 1 micron per minute, on an area of 35 square centimeters. A coated object with a film thickness of 25 microns was obtained. The color of the as-deposited film was dark black.

EXAMPLE 2

Barium oxide was mixed with calcium oxide and copper oxide to form an intermediate material with the formula $Ba_2Ca_2Cu_3O_x$.

This intermediate material was heat-treated. It was placed in a muffle furnace and raised to a temperature of 850 degrees Centigrade at a rate of 10 degrees per minute. Thereafter, while under atmospheric pressure, it was maintained at 850 degrees Centigrade for 24 hours. Therafter, it was cooled at a rate of 2 degrees Centigrade per minute to room temperature.

The heat-treated material was then ground until substantially all of its particles were smaller than 30 microns. Thereafter, a thallination agent was prepared by mixing thallium oxide ($Tl_2O_3$) with the ground $Ba_2Ca_2Cu$ material. The materials were thoroughly mixed in a 1:1 mole ratio to form $Tl_2Ba_2Ca_2Cu_3O_{10-y}$. Thereafter, this mixture was pressed with a Carver laboratory press at a pressure of 5,000 pounds per square inch to form pellets which were 2.54 centimeters in diameter and 0.5 centimeter thick.

The pelletized $Tl_2Ba_2Ca_2Cu_3O_{10-y}$ material was used to thallinate the coated substrate of Example 1.

The aforementioned thallination disc was placed into an quartz boat which was 10 centimeters long and about 2 centimeters deep. Thereafter, the coated substrate of Example 1 was placed about 0.5 millimeter above the top surface of thallination pellet, supported on a copper O-ring. The substrate was placed on the O-ring so that the film on the substrate was facing the surface of the thallination pellet.

A sealed quartz tubular quartz furnace equipped with an oxygen inlet line and a thallium-safe exhaust line, with an internal diameter of about 7.5 centimeters and a length of about 50 centimeters, was preheated to a temperature of 800 degrees Centigrade. Thereafter, the quartz boat assembly was placed into this preheated furnace and subjected to a temperature of 800 degrees Centigrade for 25 minutes. During this heating, oxygen was flowed over the heated sample at a rate of 2 milliliters per minute, and thallium gas was vented to a hydochloric acid solution, wherein it was neutralized.

After being so heated, the sample was cooled from 800 degrees Centigrade to 640 degrees Centigrade at a rate of 3 degrees per minute; during this cooling, the oxygen flow was continued. Once the sample had cooled to 640 degrees Centigrade, the furnace was turned off, and the sample was allowed to furnace cool to ambient; oxygen flow was continued during this further cooling.

Once the sample had reached ambient temperature, the oxygen flow was ceased and the sample was removed from the furnace.

Figure 3:
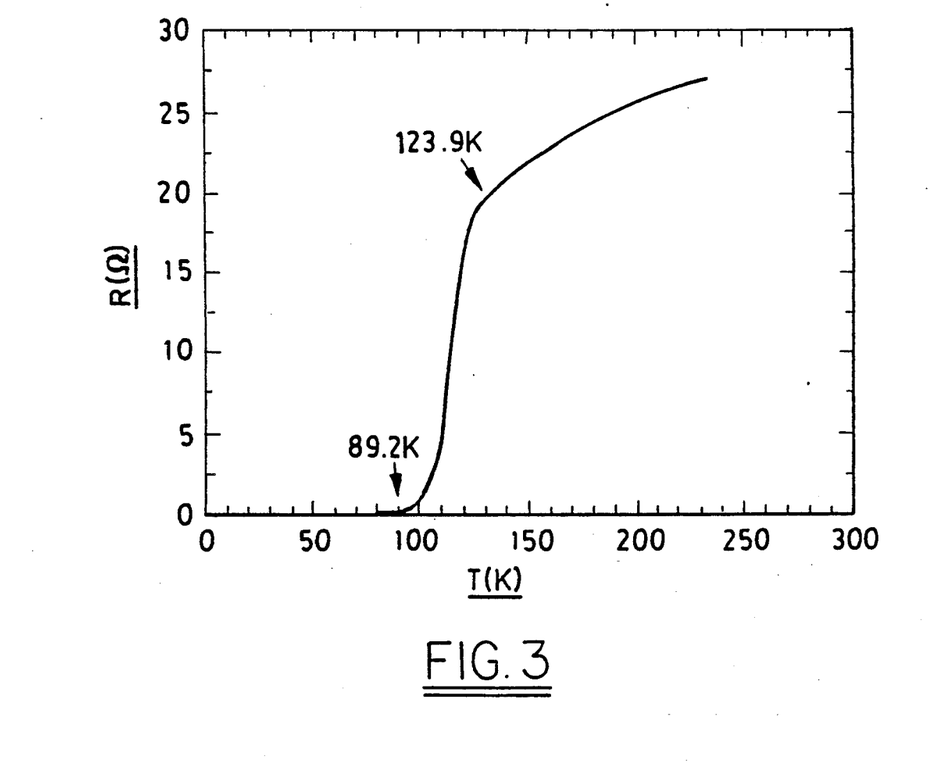
FIG. 3 is a plot of resistance versus temperature for a composition produced in an experiment described in Example 2.

The resistance of the sample was determined by a standard four point measurement technique described in U.S. Pat. No. 4,960,760. A plot of resistance versus temperature for this sample is plotted in FIG. 3. The superconducting onset temperature of the sample was 124 degrees Kelvin. The zero resistance temperature of the sample was 89 degrees Kelvin.

EXAMPLE 3

The procedure of Examples 1 and 2 were substantially followed with the exceptions that the thallination was conducted at a temperature of 825 degrees Centigrade for 5 minutes, the thallinated sample was then cooled to 700 degrees Centigrade at a rate of 1 degree Centigrade per minute, and thereafter the material was cooled to 500 degrees Centigrade at a rate of 3 degrees Centigrade per minute, and then the furnace was turned off.

Figure 4:
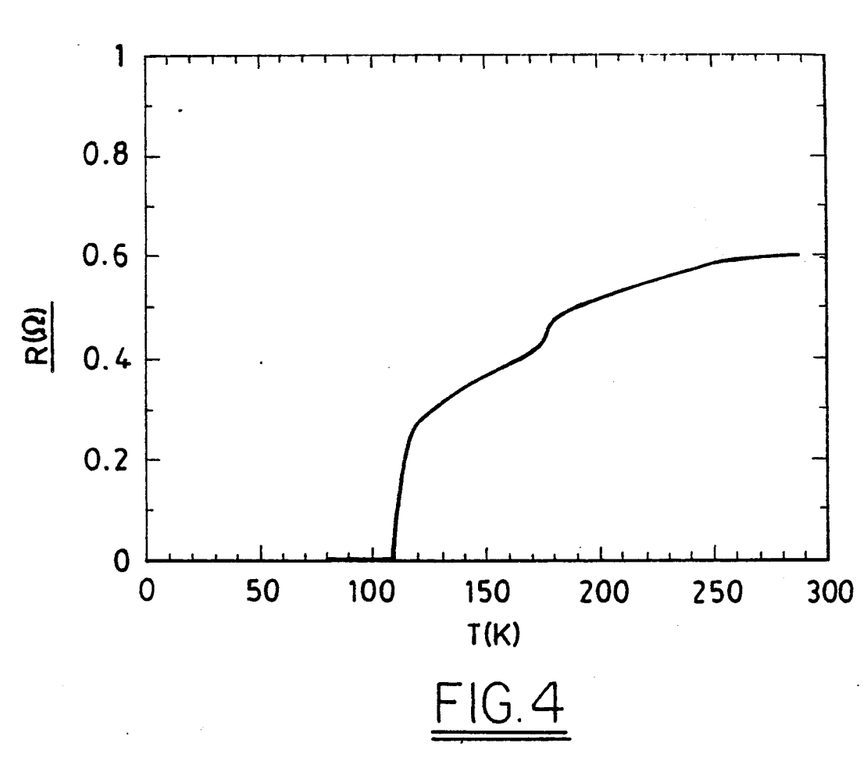
FIG. 4 is a plot of resistance versus temperature for a composition produced in an experiment described in Example 3.

A plot of resistance versus temperature for this sample is shown in FIG. 4. The superconducting onset temperature of this sample was 125 degrees Kelvin. The zero resistance temperature of this material was 108 degrees Kelvin.

It is to be understood that the aforementioned description is illustrative only and that changes can be made in the apparatus, the ingredients and their proportions, and in the sequence of combinations and process steps as well as in other aspects of the invention discussed herein without departing from the scope of the invention as defined in the following claims.

We claim:

1. A process for preparing a superconducting film of the formula $(AO)_m M_2 Ca_{n-1} Cu_n O_{2n+2}$, wherein A is selected from the group consisting of thallium, a mixture of thallium and lead, and a mixture of thallium and bismuth, m is from about 1 to about 2, M is selected from the group consisting of barium, strontium, and mixtures thereof, and n is from about 1 to about 4, comprising the steps of:
   (a) providing a precursor film with a thickness of from about 0.1 to about 500 microns, wherein said film consists essentially of material of the formula $Ca_{n-1}M_2Cu_nO_x$, wherein x is less than about 11, and wherein said film is provided by a process comprising the steps of:
   1. providing a solution comprised of a first compound selected from the group consisting of barium compound, strontium compound, and mixtures thereof, a second calcium compound, and a third copper compound, wherein said first, second, and third compounds are present in said solution in the stoichiometric ratio of $n-1:2:n$, and wherein said solution is comprised of from about 0.01 to about 1,000 grams of a mixture consisting essentially said first compound, said second calcium compound, and said third copper compound per liter of said solution;
   2. subjecting said solution to ultrasonic sound waves at a frequency in excess of 20,000 hertz, and to a substantially atmospheric pressure of at least about 760 millimeters of mercury, thereby causing said solution to form into an aerosol;
   3. providing a radio frequency plasma reactor;
   4. generating a plasma within said radio frequency reactor;
   5. contacting said aerosol with said plasma gas reactor while subjecting said aerosol to a substantially atmospheric pressure of at least about 760 millimeters of mercury and to a radio frequency alternating current at a frequency of from about 100 kilohertz to about 30 megahertz, thereby forming a vapor;
   6. providing a substrate disposed outside of said plasma reactor, wherein said substrate is located at least 10 centimeters away from the top of said plasma reactor;
   7. providing a substrate holder in contact with said substrate;
   8. electrically grounding said substrate holder;
   9. maintaining said substrate at a temperature of from about 550 to about 650 degrees Centigrade; and 10. contacting said vapor with said substrate, thereby forming a precursor film;

(b) disposing said precursor film within a sealed furnace; and (c) heating said precursor film to a temperature of from about 750 to about 900 degrees Centigrade while contacting said precursor film to thallium-containing vapor for at least about 1 minute.

2. The process as recited in claim 1, wherein n is 3.

3. The process as recited in claim 1, wherein n is 2.

4. The process as recited in claim 1, wherein n is 4.

5. The process as recited in claim 1, wherein n is 1.

6. The process as recited in claim 1, wherein A is thallium.

7. The process as recited in claim 6, wherein m is 2.

8. The process as recited in claim 7, wherein M is barium.

9. The process as recited in claim 8, wherein n is 3.

10. The process as recited in claim 9, wherein said thallium-containing vapor is produced by heating a solid, thallium-containing material.

11. The process as recited in claim 10, wherein said thallium-containing material has a particle size such that substantially all of its particles are smaller than about 50 microns.

12. The process as recited in claim 11, wherein said thallium-containing material is in the form of a pellet.

13. The process as recited in claim 12, wherein said thallium-containing material and said precursor film are placed into a preheated furnace at a temperature of from about 750 to about 900 degrees Centigrade.

14. The process as recited in claim 13 wherein said thallium-containing material and said precursor film are heated to a temperature of from about 750 to about 900 degrees Centigrade while oxygen is flowed over said material at a rate of from about 0.1 to about 20 milliliters per minute.

15. The process as recited in claim 14, wherein, after said precursor film and said thallium-containing material have been heated to said temperature of from about 750 to about 900 degrees Centigrade for at least about 1 minute, they are cooled at a rate of from about 0.5 to about 10 degrees Centigrade per minute.

16. The process as recited in claim 15 wherein, while said precursor film and said thallium-containing materials are being cooled at a rate of from about 0.5 to about 10 degrees Centigrade per minute, oxygen is flowed over said materials at a rate of from about 0.1 to about 20 milliliters per minute.

17. The process as recited in claim 16, wherein said precursor film and said thallium-containing material are heated at a temperature of about 800 degrees Centigrade.

18. The process as recited in claim 17, wherein said precursor film and said thallium-containing material are heated at a temperature of about 800 degrees Centigrade for about 25 minutes.

19. The process as recited in claim 16, wherein said precursor film and said thallium-containing material are heated at a temperature of about 825 degrees Centigrade.

20. The process as recited in claim 19, wherein said precursor film and said thallium-containing material are heated at a temperature of about 825 degrees Centigrade for about 5 minutes.

* * * * *